(12) United States Patent
Kent (10) Patent No.: US 8,459,140 B2
(45) Date of Patent: Jun. 11, 2013

(54) ADJUSTABLE WRIST DESIGN FOR ROBOTIC ARM

(75) Inventor: Richard J. Kent, Newbury, NH (US)

(73) Assignee: Fabworx Solutions, Inc., Austin, TX (US)

( * ) Notice: Subject to any disclaimer, the term of this patent is extended or adjusted under 35 U.S.C. 154(b) by 1427 days.

(21) Appl. No.: 11/788,365

(22) Filed: Apr. 18, 2007

(65) Prior Publication Data

US 2008/0257095 A1 Oct. 23, 2008

(51) Int. Cl.
*B66C 23/00* (2006.01)
*B25J 17/00* (2006.01)
*B25J 17/02* (2006.01)
*B25J 18/00* (2006.01)

(52) U.S. Cl.
USPC ..................... 74/490.06; 414/744.3

(58) Field of Classification Search
USPC ............... 74/490.01, 490.05, 490.06; 901/29, 901/30; 414/744.1, 744.2, 744.6, 744.7
See application file for complete search history.

(56) References Cited

U.S. PATENT DOCUMENTS

| 4,299,529 | A | * | 11/1981 | Inaba et al. | 414/590 |
|---|---|---|---|---|---|
| 4,555,217 | A | | 11/1985 | Wright | |
| 5,333,986 | A | | 8/1994 | Mizukami et al. | |
| 5,464,444 | A | | 11/1995 | Farquharson et al. | |
| 5,682,795 | A | | 11/1997 | Solomon et al. | |
| 5,743,704 | A | * | 4/1998 | Caveney et al. | 414/744.5 |
| 6,077,027 | A | | 6/2000 | Kawamura et al. | |
| 6,117,238 | A | * | 9/2000 | Begin | 118/500 |
| 6,189,404 | B1 | | 2/2001 | Hatake et al. | |
| 6,222,337 | B1 | | 4/2001 | Kroeker et al. | |
| 6,360,459 | B1 | | 3/2002 | Brookhart et al. | |
| 6,634,851 | B1 | | 10/2003 | Bonora et al. | |
| 7,175,381 | B2 | * | 2/2007 | Guerra | 414/744.5 |
| 2002/0166404 | A1 | | 11/2002 | Rosheim | |
| 2004/0076505 | A1 | * | 4/2004 | Kinnard et al. | 414/744.2 |
| 2005/0238474 | A1 | * | 10/2005 | Kent | 414/744.5 |
| 2009/0226285 | A1 | * | 9/2009 | Kent | 414/222.04 |
| 2010/0178135 | A1 | * | 7/2010 | Laceky et al. | 414/217 |

OTHER PUBLICATIONS

"Wafer Transport Robot replaces processed wafer in 4 seconds"; Industrial News Room; Asyst Technologies, Inc.; www.industrialnewsroom.com/fullstory12450; five pages; May 13, 2004.
"Asyst's New AXYS Fastswap Advanced Wafer Transport Robot Reduces Wafer-Swap Times by 50-100 Percent"; Asyst Technologies, Inc. Press Release; Jul. 12, 2002; 2 pages.

* cited by examiner

*Primary Examiner* — Justin Krause
(74) *Attorney, Agent, or Firm* — John A. Fortkort; Fortkort & Houston P.C.

(57) ABSTRACT

A wrist assembly is provided for securing an end effector to a robotic arm. The wrist assembly comprises a first portion (205, 207) containing a slot for releasably engaging an end effector (231), and a second portion (203) which is attached to the first portion. The orientation of the first portion with respect to the second portion is adjustable to impart a leveling effect to the end effector.

24 Claims, 11 Drawing Sheets

ADJUSTABLE WRIST DESIGN FOR ROBOTIC ARM

FIELD OF THE DISCLOSURE

The present disclosure relates generally to robots, and more particularly to adjustment mechanisms for leveling end effectors and robotic arms.

BACKGROUND OF THE DISCLOSURE

The use of robots has become ubiquitous in the semiconductor industry. Such robots have the ability to process a large number of semiconductor wafers through many different processing technologies, and can perform repetitive tasks quickly and accurately. The use of robots is especially desirable in portions of semiconductor fabrication lines where human handling of semiconductor wafers is inefficient or undesirable. For example, many semiconductor fabrication processes, such as etching, deposition, and passivation, occur in reaction chambers having sealed environments. The use of robots allows these environments to be carefully maintained in order to minimize the likelihood of contamination and to optimize processing conditions.

Many of the robots currently used in the semiconductor industry utilize an end effector (also known as a blade or carrier) which is attached to one or more robotic arms. These robots are commonly used to load semiconductor wafers from a loading port into various processing ports within a multiple chamber reaction system. The robotic arms are then employed to retrieve the wafer from a particular port after the wafer has been processed. The wafer is then shuttled by the robotic arms to the next port for additional processing. When all processing within the reaction system is complete, the robotic arm returns the semiconductor wafer to the loading port, and the next wafer is placed into the system by the robotic arm for processing. Typically, a stack of several semiconductor wafers is handled in this manner during each process run.

Many modern semiconductor processes are performed at high temperatures (frequently in excess of 500° F.) using various thermal processing techniques. Such processes include, for example, silicide formation, implant anneals, oxidation, diffusion drive-in, and chemical vapor deposition (CVD) processes. Robots designed to handle semiconductor wafers in these processes must therefore be equipped with end effectors which can withstand the high temperature conditions they encounter. Since the modulus of aluminum decreases noticeably at higher temperatures, the use of aluminum end effectors under these conditions can lead to placement errors. It has therefore become common in the art to utilize quartz or ceramic end effectors in high temperature processes. Although quartz or ceramic end effectors are typically more expensive than their aluminum counterparts, their comparatively higher moduli at higher processing temperatures serve to minimize placement errors.

SUMMARY OF THE DISCLOSURE

In one aspect, a wrist assembly is provided for securing an end effector to a robotic arm. The wrist assembly comprises a first portion containing a slot for releasably engaging an end effector, and a second portion which is attached to the first portion. The orientation of the first portion with respect to the second portion is adjustable to impart a leveling effect to the end effector.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION

While the use of quartz or ceramic end effectors in high temperature semiconductor fabrication processes is advantageous from the standpoint of the higher moduli that these end effectors offer, the use of such end effectors also presents certain challenges. In particular, quartz and ceramic end effectors are significantly more brittle than their aluminum counterparts. On the other hand, many existing robots designed for use in semiconductor fabrication lines were originally designed for use with aluminum end effectors. When quartz or ceramic end effectors are substituted for conventional aluminum end effectors in these tools, these end effectors typically exhibit a notably higher incidence of fracture than their aluminum counterparts. Such fractures are found to be especially prevalent at the edge grip/end effector interface.

Without wishing to be bound by theory, this result is believed to be due to the high compressive force exerted by conventional edge grips which are used to mount end effectors on robotic wrist assemblies, in combination with the more brittle nature of quartz and ceramics as compared to aluminum. This problem may be further compounded if additional compressive force is applied to the end effector for the purposes of leveling.

It has now been found that the aforementioned infirmities in the art may be overcome through the provision of a wrist assembly design that provides a leveling functionality which is decoupled from the end effector mounting functionality. Such a design may be achieved through the provision of a mount whose angular orientation with respect to the wrist assembly of the robot is adjustable to achieve leveling, and which is equipped with a separate means (such as, for example, set screws, dowels or other such devices) to secure the end effector in place within the mount.

Since the mounting functionality in such a design is decoupled from the leveling functionality, the end effector may be mounted with only the minimum compressive force required to hold the end effector in place. The compressive force imparted by the wrist assembly on the end effector may be further reduced through the provision of a mount which is complimentary in shape to the edge of the end effector. The lower compressive forces imparted to the end effector by such a wrist assembly permits the use of more brittle quartz and ceramic end effectors with these assemblies, while reducing or eliminating the incidence of fractures at the edge grip/end effector interface. Moreover, since wrist assemblies of this type may be fabricated as replacement parts, they may be used to retrofit existing tools for operation in high temperature environments.

It has further been found that the aforementioned type of wrist assembly may be used in conjunction with an adjustment mechanism which may be built into the robotic arms to adjust the height of the arms on the robotic hub to which they are attached. The combination of such an arm adjustment mechanism with the aforementioned wrist assembly permits greater control over, and refinement of, the orientation of robotic arms and the end effectors attached thereto.

Prior to describing the wrist assemblies and arm adjustment mechanisms disclosed herein in greater detail, a brief description is provided of one particular, non-limiting example of a suitable robot into which these wrist assemblies and arm adjustment mechanisms may be incorporated. The robot described is disclosed in U.S. Pat. No. 6,222,337 (Kroeker et al.), and is reproduced in FIGS. 1-4 herein. It will be appreciated, however, that the devices and methodologies described herein are applicable to a wide range of robots and manufacturing processes, and hence are not limited to their use in conjunction with robots of the type disclosed in FIGS. 1-4.

The magnetically coupled robot disclosed in FIGS. 1-4 is equipped with robotic arms having a frog-leg type construction which are adapted to provide both radial and rotational movement of a robotic blade within a fixed plane. The radial and rotational movements may be coordinated or combined to allow for pickup, transfer and deliver of wafers from one location within a cluster tool to another location. For example, the robotic arm may be used to move substrates from one processing chamber to an adjacent processing chamber.

Figure 1:
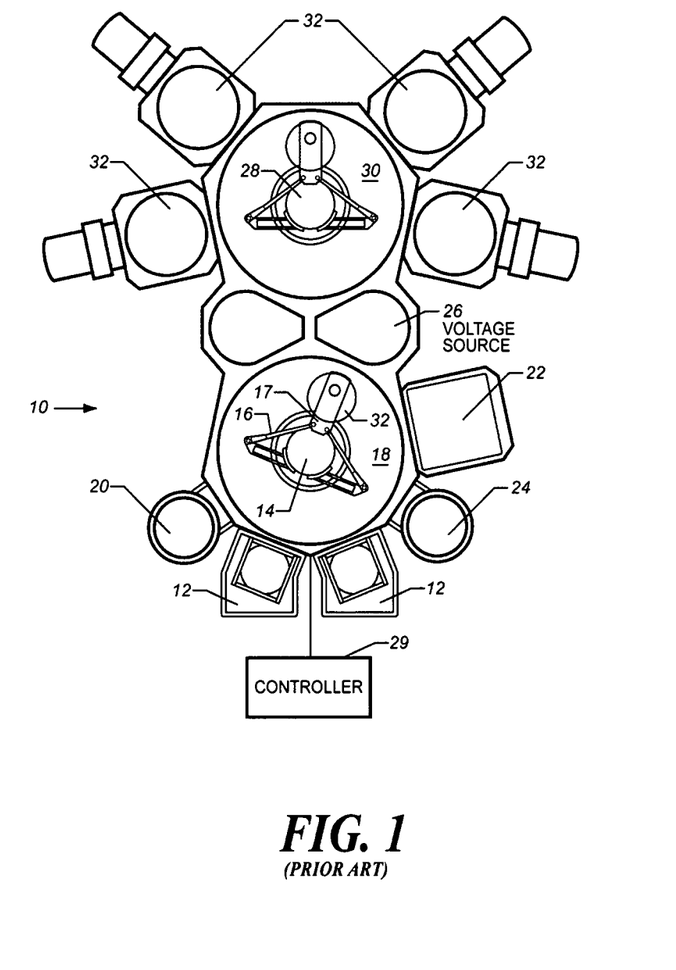
FIG. 1 is an illustration of a prior art cluster tool equipped with a robotic wafer handling system.

FIG. 1 is a schematic diagram of the integrated cluster tool 10 of Kroeker et al. Wafers are introduced into, and withdrawn from, the cluster tool 10 through a cassette loadlock 12. A robot 14 having an end effector 17 is located within the cluster tool 10 to transfer wafers from one processing chamber 20 to another. These processing chambers may include a cassette load lock 12, a degas wafer orientation chamber 20, a pre-clean chamber 24, a PVD TiN chamber 22 and a cooldown chamber 26. The end effector 17 is illustrated in the retracted position in which it can rotate freely within the chamber 18.

A second robot 28 is located in transfer chamber 30 and is adapted to transfer wafers between various chambers, such as the cool-down chamber 26, the pre-clean chamber 24, the CVD Al chamber (not shown) and the PVD AlCu processing chamber (not shown). The specific configuration of chambers illustrated in FIG. 1 is designed to provide an integrated processing system capable of both CVD and PVD processes in a single cluster tool. A microprocessor controller 29 is provided to control the fabricating process sequence, conditions within the cluster tool, and the operation of the robots 14, 28.

Figure 2:
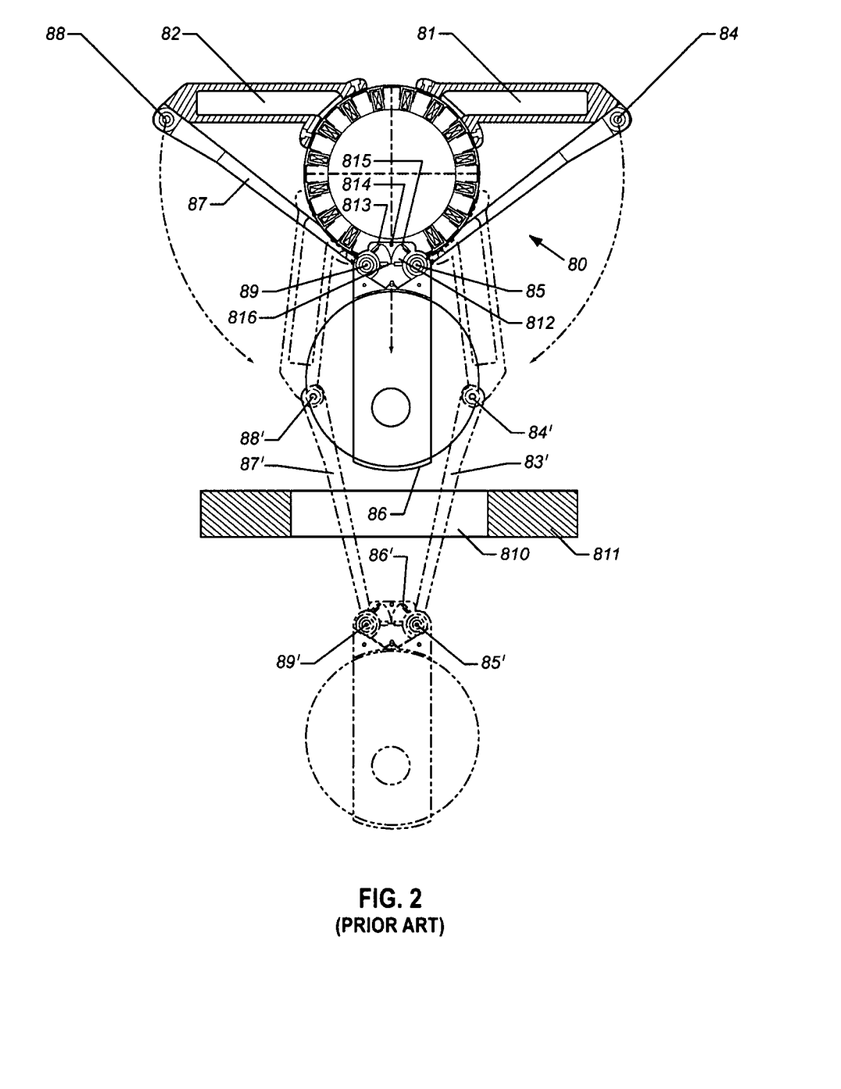
FIG. 2 is an illustration of the arm assembly of the robot depicted in FIG. 1, and illustrates the retracted and extended positions of the arm assembly.

FIG. 2 is a schematic view of the magnetically coupled robot of FIG. 1 shown in both the retracted and extended positions. The robot 14 (see FIG. 1) includes a first strut 81 which is rigidly attached to a first magnet clamp 80, and a second strut 82 which is rigidly attached to a second magnet clamp 80'. A third strut 83 is attached by a pivot 84 to strut 81 and by a pivot 85 to end effector 86. A fourth strut 87 is attached by a pivot 88 to strut 82 and by a pivot 89 to end effector 86. The structure of struts 81-83, 87 and pivots 84, 85, 88, and 89 form a "frog leg" type connection of end effector 86 to magnet clamps 80,80'.

When magnet clamps 80, 80' rotate in the same direction with the same angular velocity, then the robot also rotates about axis x in this same direction with the same velocity. When magnet clamps 80, 80' rotate in opposite directions with the same absolute angular velocity, then there is no rotation of assembly 14, but instead there is linear radial movement of end effector 86 to a position illustrated by dashed elements 81'-89'.

Figure 3:
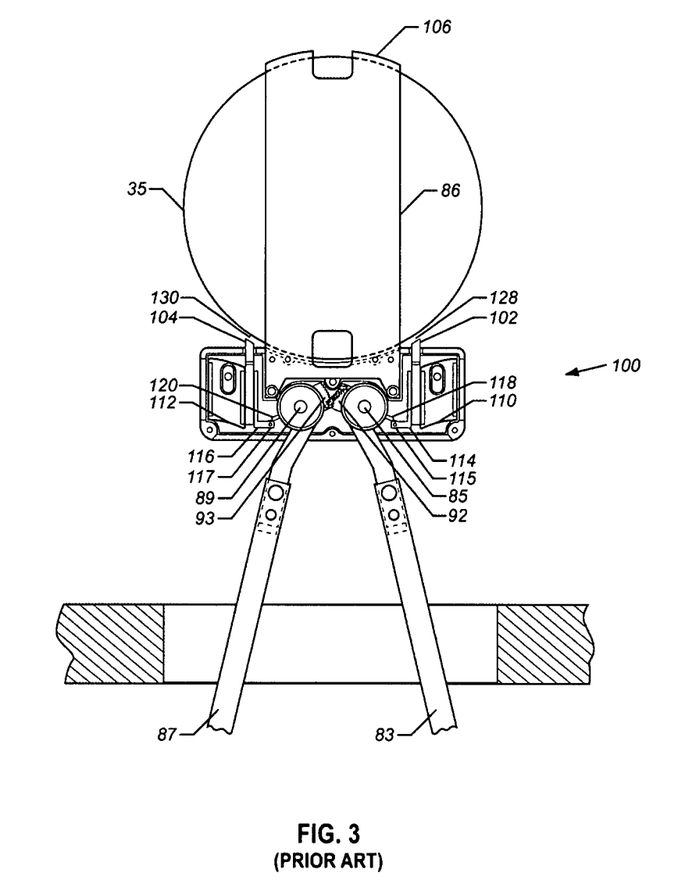
FIG. 3 is an illustration of the wrist assembly of the robot depicted in FIG. 1.
Figure 4:
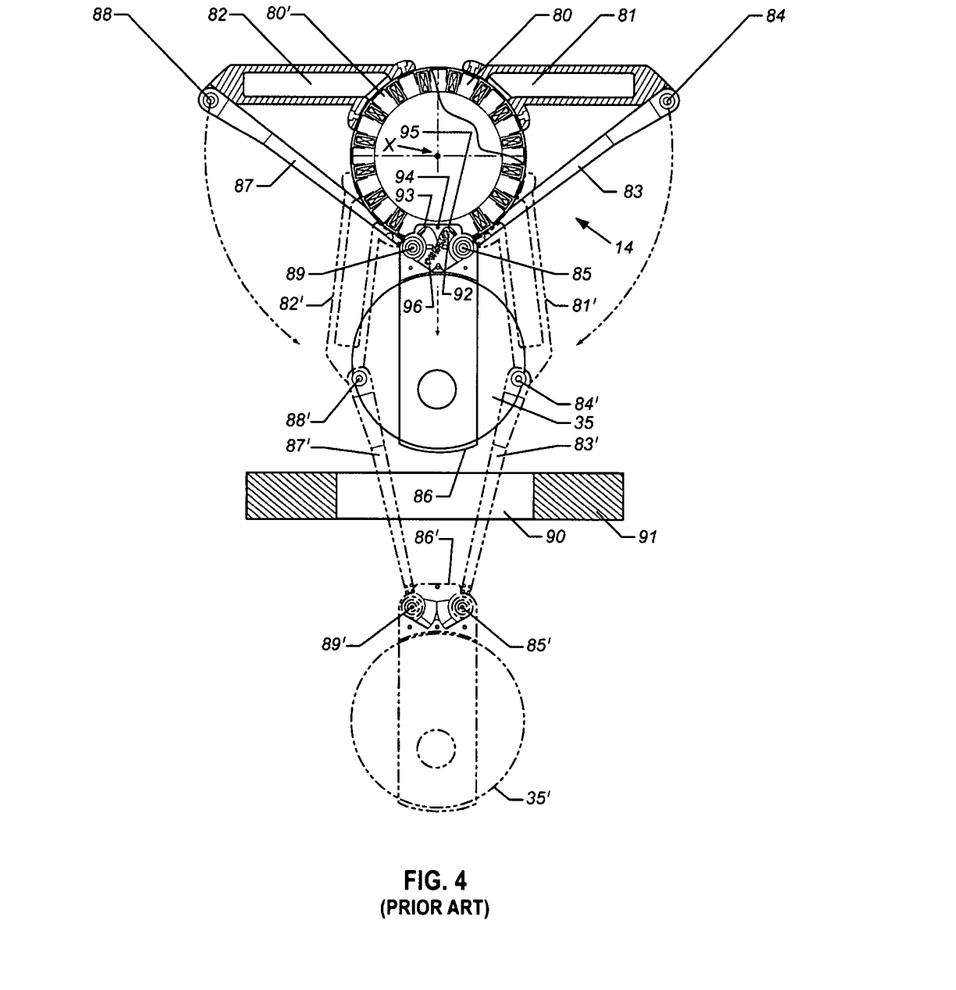
FIG. 4 is an illustration of a prior art robotic arm assembly and illustrates the retracted and extended positions of the arm assembly.

With reference to FIG. 3, a wafer 35 is shown being loaded on end effector 86 to illustrate that the end effector can be extended through a wafer transfer slot in a wall of a chamber 32 to transfer such a wafer into or out of the chamber 32. The mode in which both magnet clamps 80, 80' rotate in the same direction at the same speed can be used to rotate the robot from a position suitable for wafer exchange with one of the adjacent chambers 12, 20, 22, 24, 26 (see FIG. 1), to a position suitable for wafer exchange with another of these chambers. The mode in which both magnet clamps 80, 80' rotate with the same speed in opposite directions is then used to extend the end effector into one of these chambers and then extract it from that chamber. Some other combination of clamp rotation may be used to extend or retract the end effector as the robot is being rotated about axis x.

To keep end effector 86 directed radially away from the rotation axes x, an interlocking mechanism is used between the pivots or cams 85, 89 to assure an equal and opposite angular rotation of each pivot. The interlocking mechanism may take on many designs. One possible interlocking mechanism is a pair of intermeshed gears 92 and 93 formed on the pivots 85 and 89. These gears are loosely meshed to minimize particulate generation by these gears. To eliminate play between these two gears because of this loose mesh, a weak spring 94 (see FIG. 4) may be extended between a point 95 on one gear to a point 96 on the other gear such that the spring tension lightly rotates these two gears in opposite directions until light contact between these gears is produced.

FIGS. 5-8 illustrate a first particular, non-limiting embodiment of a wrist assembly in accordance with the teachings herein which may be incorporated into a robot such as that depicted in FIGS. 1-4. As seen in FIGS. 5-8, the wrist assembly 201 in this particular embodiment comprises a wrist plate 203, a top leveling plate 205, and a lower mounting plate 207. The wrist plate 203 is secured to the forearms 212 of the robot (see FIG. 5) and is equipped with first 209 and second 211 fingers which extend, respectively, along first and second peripheral edges of the wrist plate 203.

The top leveling plate 205, in turn, is equipped with first 213 and second 215 recesses which are disposed, respectively, along first and second peripheral edges of the top leveling plate 205, and which are complimentary in shape to the first 209 and second 211 fingers. The first 209 and second 211 fingers are secured in the first 213 and second 215 recesses of the top leveling plate 205 by means of threaded mounting bolts 216 which extend through apertures 217 provided in each of the first 209 and second 211 fingers, and which rotatingly engage a threaded receptacle 219 provided in each of the first 213 and second 215 recesses.

Figure 5:
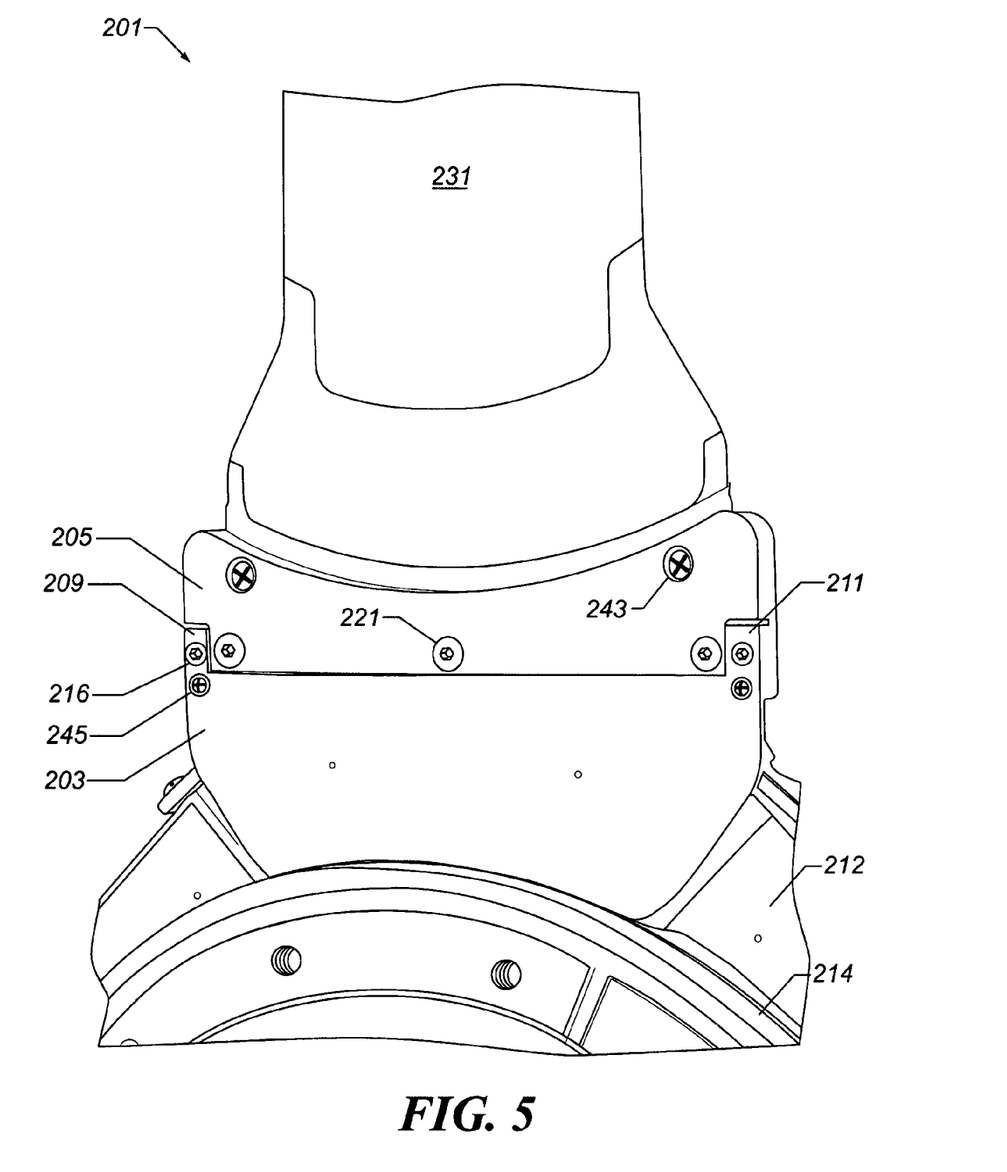
FIG. 5 is a perspective view of a wrist assembly made in accordance with the teachings herein.
Figure 6:
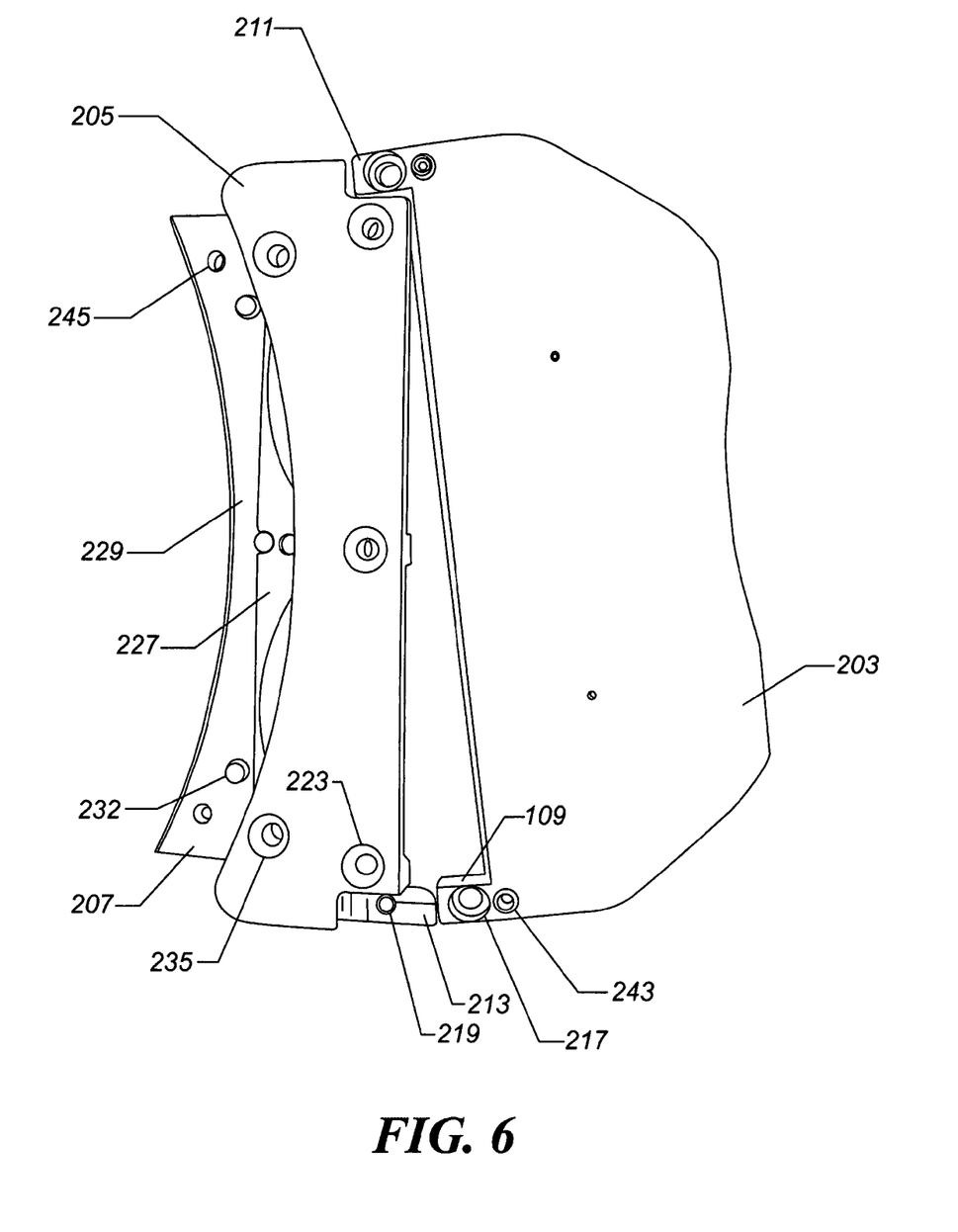
FIG. 6 is a top view of some of the components of the wrist assembly of FIG. 5.
Figure 7:
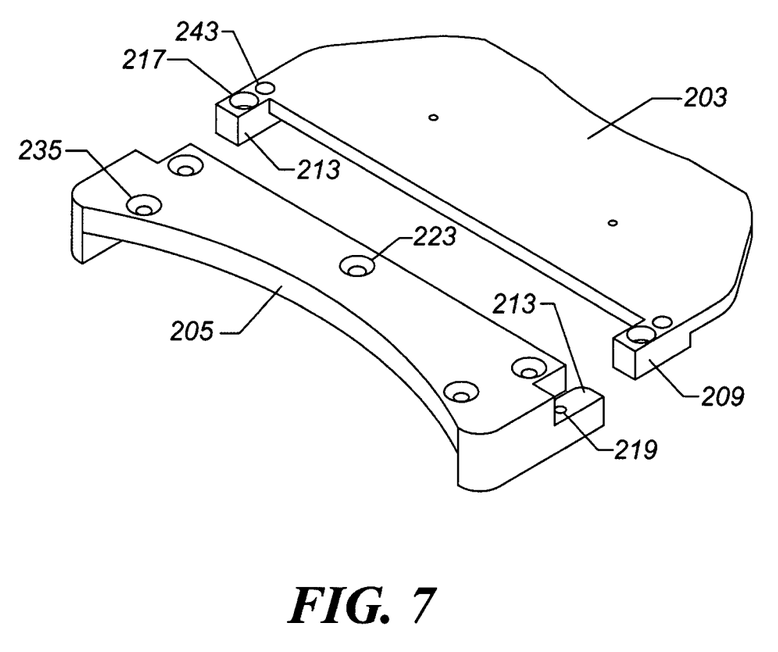
FIG. 7 is a perspective view of some of the components of the wrist assembly of FIG. 5.
Figure 8:
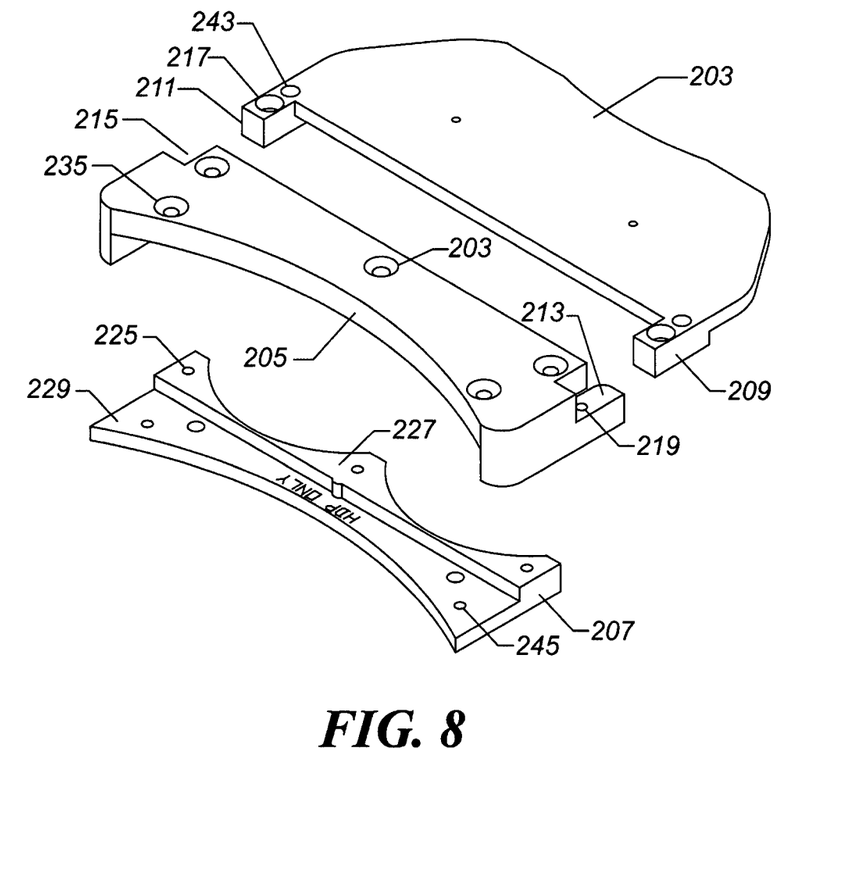
FIG. 8 is a perspective view of some of the components of the wrist assembly of FIG. 5.

As best seen in FIG. 5, the top leveling plate 205 is secured to the lower mounting plate 207 by means of a first set of threaded flat head screws 221 which extend through a first set of apertures 223 provided in the top leveling plate, and which rotatingly engage a set of threaded apertures 225 provided in a raised portion 227 of the lower mounting plate 207. The lower mounting plate 207 is also equipped with a recessed portion 229 which is adjacent to the raised portion 227. When the first set of flat head screws 221 are engaged in the respective threaded apertures 225 in the lower mounting plate 207 and are tightened, the bottom planar surface (not shown) of the top leveling plate 205 is brought into abutting contact with the lower mounting plate 207 across the planar surface of the raised portion 227.

The bottom planar surface of the top leveling plate 205 also extends over the recessed portion 229 of the lower mounting plate 207, thereby creating a slot for releasably receiving an edge of the end effector 231. This slot is preferably somewhat complimentary in shape to the edge of the end effector 231. The boundary between the raised portion 227 and the recessed portion 229 of the lower mounting plate 207 forms a lip which arrests the insertion of the end effector 231 into the slot so formed. A plurality of dowel pins 232 are also provided to ensure proper orientation of the end effector 231 within this slot. Preferably, the end effector 231 is provided with peripheral recesses which engage the dowels 232 and thereby key the end effector 231 in place.

The top leveling plate 205 is further equipped with a second set of threaded flat head screws 243 which extend through a second set of threaded apertures 235 provided in the top leveling plate 205 and which rotatingly engage a complimentary set of threaded apertures 245 provided in the lower mounting plate 207, thereby applying sufficient compressive force to maintain the end effector 231 in a rigidly fixed position within the slot. Preferably, the end effector 231 is provided with a set of apertures through which the second set of threaded flat head screws 243 extend, thereby maintaining the end effector 231 in place and ensuring proper alignment of the end effector 231 within the slot.

The wrist assembly 201 depicted in FIGS. 5-8 may be leveled through the use of a set of leveling screws 245, each of which extends through, and rotatingly engages, a second threaded aperture 243 provided adjacent to the first set of apertures 217 provided in each of the first 209 and second 211 fingers. As each leveling screw 245 advances through the second threaded aperture 243, it presses against the metal surface of the underlying recess 213, 215, thereby adjusting the angle between the wrist plate 203 and the leveling plate 205, and hence adjusting the angle of the plane of the end effector 231 to the wrist assembly. Notably, adjustment of this angle occurs without applying any additional compressive force to the end effector 231. It will also be appreciated that the leveling screws 241 may be independently adjusted on each side of the wrist plate 203.

Preferably, the first 209 and second 211 fingers engage the first 213 and second 215 recesses at a slight downward angle (preferably about 2°) so that, as the leveling screws 245 are fastened, the end effector 231 may be leveled (e.g., by bringing the top leveling plate 205 and the wrist plate 203 into co-planarity). The use of such a downward angle enables the end effector 231 to be adjusted not only upward but also downward, in the event that the original mounting results in a slight upward orientation in the end effector 231.

Various fasteners may be used in the aforementioned embodiment. Preferably, the fasteners 221 and 243 are 440 nickel-coated screws, though other types of fasteners may also be utilized. Moreover, while the leveling plate 203 and the lower mounting plate 205 in this particular embodiment are constructed as separate components which are fastened together, one skilled in the art will appreciate that other embodiments are possible in accordance with the teachings herein in which these components are formed as a unitary construct.

Figure 9:
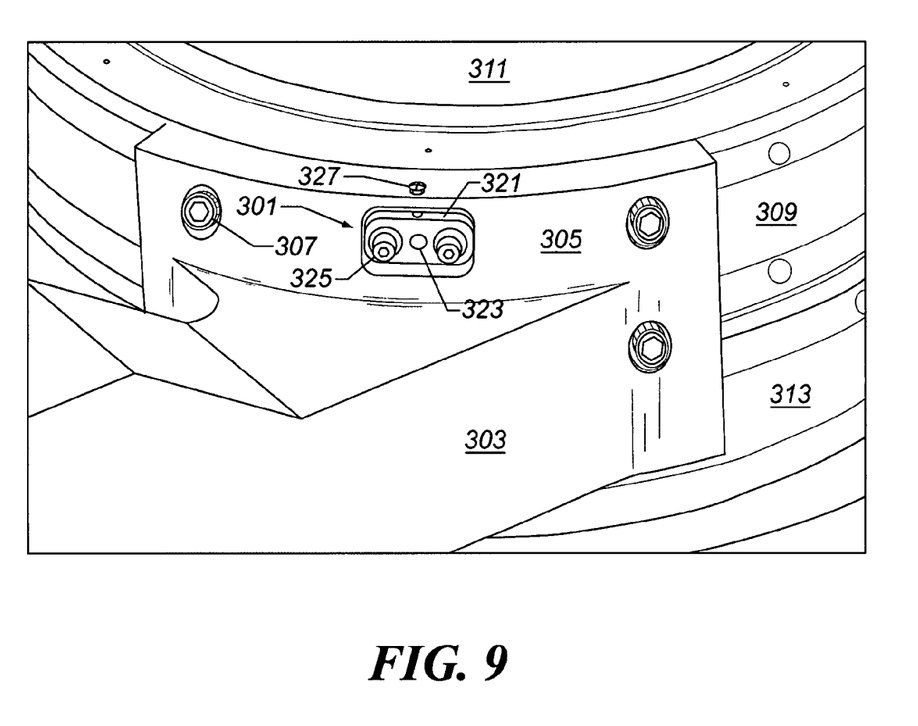
FIG. 9 is a perspective view of a first (top) robotic arm equipped with a leveling mechanism of the type disclosed herein.
Figure 10:
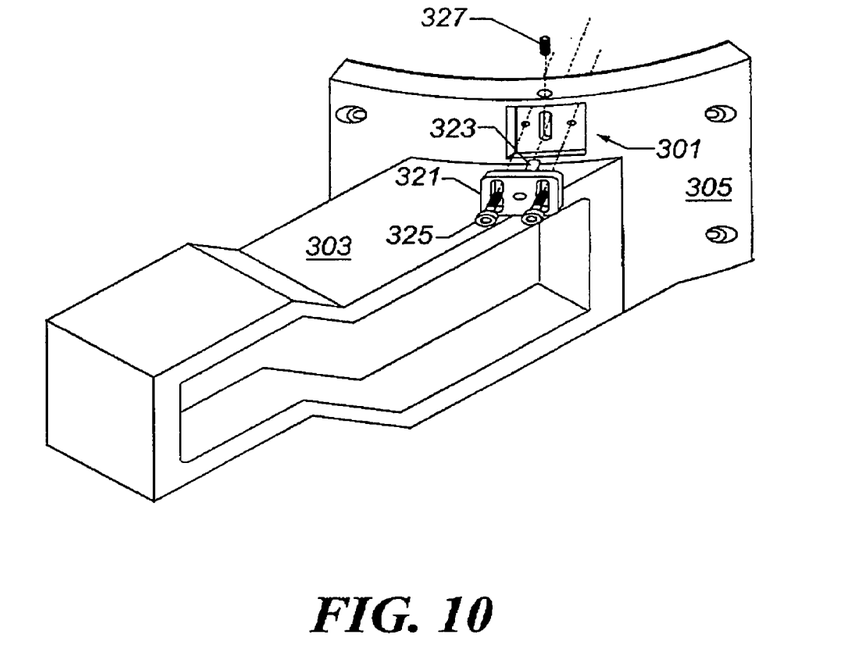
FIG. 10 is an exploded view which better illustrates some of the components of FIG. 9 and how those components are assembled together.

FIGS. 9-10 illustrate a specific, non-limiting embodiment of a robotic arm adjustment mechanism in accordance with the teachings herein by which a robotic arm (to which an end effector is attached) may be adjusted in a vertical direction. Such a mechanism may be used to achieve leveling and proper vertical alignment between the robotic arm (and the end effector attached thereto) and a semiconductor fabrication processing module. It will be appreciated that this adjustment means may be used in conjunction with the end effector adjustment mechanism described above to achieve and fine tune total end effector and arm alignment.

As seen in FIGS. 9-10, a first adjustment mechanism 301 is provided which adjusts the orientation of the first arm 303 of the robot. The first adjustment mechanism 301 is built into the terminal plate 305 of the first arm 303. The terminal plate 305 is secured by a plurality of mounting bolts 307 to the peripheral portions of a first magnetic ring 309 mounted on the surface of the robotic hub assembly 311. A second robotic arm (not shown) is similarly engaged to a second magnetic ring 313 mounted on the surface of the robotic hub assembly 311. The magnetic actuation of robotic arms of this type using the first 309 and second 313 magnetic rings is controlled by circuitry internal to the hub assembly 311.

The adjustment mechanism 301 comprises a mounting block 321 which has a pin 323 pressed into a central portion thereof, and which is secured in place by a set of cap screws 325. The mounting block 321 is set into a complimentary shaped recess 331 provided in the terminal plate 305. The recess 331 is shaped to fit the mounting block 321 tightly along its vertical sides, while leaving a gap above and below the horizontal sides of the mounting block 321.

The pin 323 extends into the peripheral portion of the first magnetic ring 309. Since the first magnetic ring 309 remains stationary, the pin 323 anchors the mounting block 321 so that it remains in a fixed and stable position relative to the first magnetic ring 309. By contrast, the mounting block 321 is provided with a pair of parallel, vertically oriented slots 326 through which the cap screws 325 extend, and the recess 331 is similarly provided with a vertical slot 324 through which the pin 323 extends. This arrangement affords a slight amount of play in the orientation of the terminal plate 305 (and hence the first arm 303) with respect to the mounting block 321 and, hence, the first magnetic ring 309, especially when the cap screws 325 are loosened.

An adjusting screw 327 is provided which extends through a complimentary shaped threaded aperture provided in the terminal plate 305 to contact one edge of the mounting block 321. As the adjusting screw 327 is tightened, it presses against the edge of the mounting block 321, thereby adjusting the robotic arm upward along the vertical axis of the adjusting screw 327. Similarly, as the adjusting screw 327 is loosened, gravity causes the robotic arm to slide downward along the vertical axis of the adjusting screw 327. Preferably, the cap screws 325 are loosened somewhat while the orientation of the robotic arm is modified with the adjusting screw 327, and are tightened once the proper orientation is attained.

The foregoing adjustment mechanism 301 controls the adjustment of the robotic arm 303 which engages the first magnetic ring 309. Preferably, a second adjustment mechanism 401 of similar design is provided to control the robotic arm which engages the second magnetic ring 313. This second adjustment mechanism 401 is shown in FIG. 11.

Figure 11:
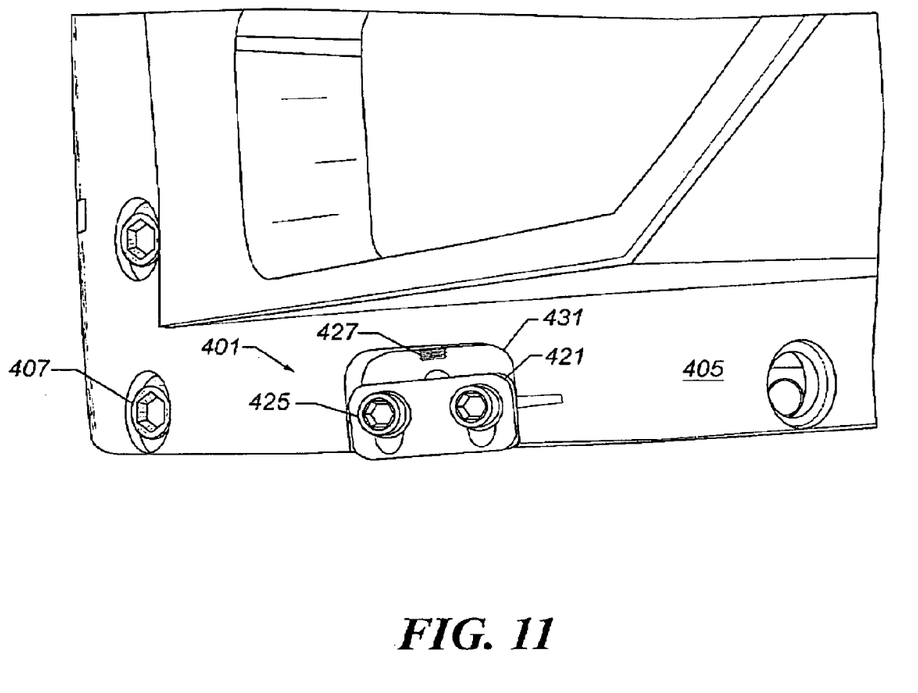
FIG. 11 is a perspective view of a second (bottom) robotic arm equipped with a leveling mechanism of the type disclosed herein.

As seen in FIG. 11, the second adjustment mechanism 401 is built into the terminal plate 405 of the second arm (not shown). The terminal plate 405 is secured by a plurality of mounting bolts 407 to peripheral portions of the second magnetic ring 313 (see FIG. 9) mounted on the surface of the robotic hub assembly 311.

The adjustment mechanism 401 comprises a mounting block 421 which is secured in place by a set of cap screws 425. An adjusting screw 427 is provided which extends through a complimentary shaped threaded aperture in the terminal plate 405 to contact the mounting block 421. The mounting block 421 is set into a complimentary shaped recess 431 provided in the terminal plate 405. The recess 431 is shaped to fit the mounting block 421 tightly along its vertical sides, while leaving a gap above and below the horizontal sides of the mounting block 421. The adjustment mechanism 401 operates in a similar manner to the adjustment mechanism 301 of FIGS. 9-10.

The foregoing adjustment mechanism is particularly useful in enabling existing robots to meet the tight design tolerances of modern semiconductor fabrication lines. In particular, many fabrication lines, such as those that feature low pressure chambers, have narrow access windows through which the end effector must pass. In some fabrication lines, the space between the edge of the window and the end effector is less than 0.25 inches. Consequently, the orientation of the robotic arm must be finely tuned to assure that the end effector will not contact the sides of the window during operation. However, many existing robots lack a suitable adjustment mechanism capable of fine tuning the orientation of the robotic arm. Moreover, some robotic arms, by construction, have a slight downward orientation, and hence must be leveled to properly interface with the chamber window. The foregoing adjustment mechanism provides a means for properly leveling the robotic arm so that it can properly interface with the chamber window.

It will be appreciated from the foregoing that the adjustment mechanisms described in FIGS. 9-10 compliment the wrist assembly depicted in FIGS. 5-8. In particular, while the adjustment mechanisms of FIGS. 9-10 level the robotic arm itself, the wrist assembly of FIGS. 5-8 levels the end effector attached to the arm. Hence, the two devices together provide a total leveling solution for robots.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A wrist assembly for securing an end effector to a robotic arm, comprising:
  a first portion containing a slot for releasably engaging an end effector;
  a second portion attached to said first portion by way of first and second opposing protrusions which extend over said first portion; and
  a first plurality of fasteners, each of which extends through one of said first and second protrusions and into said first portion;
  wherein the orientation of the first portion with respect to the second portion is adjustable to level the end effector by way of a plurality of adjusting elements, wherein each of said plurality of adjusting elements is proximal to one of said first and second protrusions, and wherein each of said plurality of adjusting elements extends through a threaded receptacle provided in said first portion and pressingly engages said second portion.

2. The wrist assembly of claim 1, wherein the first portion comprises first and second components which are compressively engaged.

3. The wrist assembly of claim 2, further comprising a second plurality of threaded fasteners, each of which extends through an aperture provided in the first component and rotatingly engages a threaded aperture provided in said second component.

4. The wrist assembly of claim 3, wherein each of said second plurality of threaded fasteners extends through an aperture provided in the end effector.

5. The wrist assembly of claim 1, wherein said second component comprises a raised portion and a recessed portion.

6. The wrist assembly of claim 5, wherein said raised portion abuts said first component, and wherein said recessed portion is disposed in spaced apart relationship to said first component to define a slot adapted to receive said end effector.

7. The wrist assembly of claim 1, wherein each protrusion is provided with a first aperture, and wherein one of said first plurality of fasteners extends through said first aperture and rotatingly engages a threaded aperture provided in said second portion.

8. The wrist assembly of claim 7, wherein each protrusion is further provided with a second threaded aperture, and wherein each of said plurality of adjusting elements extends through and rotatingly engages said second threaded aperture.

9. The wrist assembly of claim 8, wherein the first and second apertures in said protrusions are adjacent to each other.

10. An end effector in combination with the wrist assembly of claim 1, wherein said end effector is selected from the group consisting of quartz and ceramic end effectors.

11. A robot equipped with an arm which is attached on a first end to the wrist assembly of claim 1, and which is attached on a second end to a robotic hub.

12. The robot of claim 11, wherein said second end of said robotic arm is equipped with an adjustment mechanism adapted to adjust the position of said second end of said robotic arm on said hub.

13. The robot of claim 12, wherein said adjustment mechanism is adapted to adjust the position of said second end of said robotic arm on said hub in a vertical direction.

14. The robot of claim 12, wherein said second end of said robotic arm terminates in a plate which is releasably attached to said hub, and wherein the orientation of said plate on said hub is adjustable in a vertical direction with said adjustment mechanism.

15. The robot of claim 14, wherein said adjustment mechanism comprises a block which is set into a recess provided in said plate and which is mounted to said hub, and a threaded fastener which extends through a threaded aperture provided in the side of said recess to press against said block.

16. The robot of claim 15, wherein the block further comprises:
   a set of first longitudinal slots; and
   a set of fasteners which extend through said first longitudinal slots and which rotatingly engage a set of apertures defined in said plate.

17. The robot of claim 16, wherein said recess is equipped with a second longitudinal slot, and wherein said pin extends through said second longitudinal slot.

18. The robot of claim 12, wherein said adjustment mechanism comprises a plate having at least one slot defined therein, and a fastener which extends through said slot.

19. A robot, comprising:
   an end effector equipped with a planar surface which is adapted to support a semiconductor wafer thereon;
   a hub; and
   an arm which is attached on a first end to the wrist assembly of claim 1, and which is attached on a second end to said hub.

20. The wrist assembly of claim 1, wherein said first and second protrusions are disposed, respectively, in complimentary shaped first and second recessions defined in said first portion.

21. The wrist assembly of claim 1, wherein said first portion has a first straight edge, and wherein said first and second protrusions are separated by a second straight edge which abuts said first straight edge.

22. The wrist assembly of claim 1, wherein said second portion is attached to said first portion only by way of said first and second protrusions.

23. The wrist assembly of claim 1, wherein each of said first and second protrusions are rectangular in a cross-section taken in a plane perpendicular to their longitudinal axes.

24. A robot, comprising:
   a hub;
   a wrist assembly, comprising (a) a first portion containing a slot for releasably engaging an end effector, and (b) a second portion attached to said first portion, and wherein the orientation of the first portion with respect to the second portion is adjustable to level the end effector; and
   an arm which is attached on a first end to the wrist assembly, and which is attached on a second end to a robotic hub;
wherein said second end of said robotic arm terminates in a plate which is releasably attached to said hub, and wherein the orientation of said plate on said hub is adjustable in a vertical direction with said adjustment mechanism adapted to adjust the position of said second end of said robotic arm on said hub.

* * * * *